US009401770B1

United States Patent
Noll (10) Patent No.: US 9,401,770 B1
(45) Date of Patent: Jul. 26, 2016

(54) BROADBAND INTEGRATED SINGLE ENDED TO DIFFERENTIAL ACTIVE BALUN WITH AN N-WAY POWER SPLITTER, DC POWER SHUTDOWN CIRCUIT, AND /OR A DEFAULT-ON PORT

(75) Inventor: Alan L. Noll, Nashua, NH (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 13/557,717

(22) Filed: Jul. 25, 2012

Related U.S. Application Data (60) Provisional application No. 61/622,158, filed on Apr. 10, 2012.

(51) Int. Cl.
- *H03K 17/00* (2006.01)
- *H04H 20/63* (2008.01)
- *H04H 20/78* (2008.01)

(52) U.S. Cl.
CPC .............. *H04H 20/63* (2013.01); *H04H 20/78* (2013.01)

(58) Field of Classification Search
USPC .......................................................... 327/416
See application file for complete search history.

(56) References Cited

U.S. PATENT DOCUMENTS

| | | | | |
|---|---|---|---|---|
| 4,525,738 A | * | 6/1985 | Imazeki et al. | 348/706 |
| 6,057,714 A | * | 5/2000 | Andrys et al. | 327/105 |
| 2006/0189286 A1 | * | 8/2006 | Kyu et al. | 455/144 |
| 2006/0211367 A1 | * | 9/2006 | Kato et al. | 455/3.01 |
| 2007/0285154 A1 | * | 12/2007 | Darabi et al. | 327/551 |
| 2007/0294740 A1 | * | 12/2007 | Drake et al. | 725/131 |
| 2010/0132010 A1 | * | 5/2010 | Chatterton et al. | 726/1 |
| 2010/0328546 A1 | * | 12/2010 | Rafi et al. | 348/731 |

OTHER PUBLICATIONS

Alan Noll, A Novel 8-way Active Splitter for Broadband Gateway Applications—Proceedings of Asia-Pacific Microwave Conference 2010. pp. 888-891.*

* cited by examiner

*Primary Examiner* — Lincoln Donovan
*Assistant Examiner* — Patrick Chen
(74) *Attorney, Agent, or Firm* — Christopher P. Maiorana, PC (57) ABSTRACT

An apparatus comprising a switch, a balun and a splitter. The switch may be configured to provide (i) a first signal on a first path when a power signal is not present and (ii) a second signal on a second path when the power signal is present. The first path activates only the first signal. The second path activates only the second signal. The balun circuit may be configured to convert the second signal to a differential signal. The splitter circuit may be configured to generate a plurality of differential output signals in response to the differential signal.

16 Claims, 7 Drawing Sheets

BROADBAND INTEGRATED SINGLE ENDED TO DIFFERENTIAL ACTIVE BALUN WITH AN N-WAY POWER SPLITTER, DC POWER SHUTDOWN CIRCUIT, AND /OR A DEFAULT-ON PORT

This application claims the benefit of U.S. Provisional Application No. 61/622,158, filed Apr. 10, 2012, and is hereby incorporated by reference in its entirety.

FIELD OF THE INVENTION

The present invention relates to baluns generally and, more particularly, to a method and/or apparatus for implementing a broadband integrated single ended to differential active balun with an n-Way power splitter, a DC power shutdown circuit, and/or a default-on port.

BACKGROUND OF THE INVENTION

Conventional broadband receiver networks implement a number of components that split a single ended signal into multiple differential outputs. Such conventional receivers tend to consume power when the receiver is in a standby mode. Such standby power tends to deplete battery life and reduce operating times in the event of a consumer power failure.

It would be desirable to implement a circuit (or device) with an integrated active balun, default-on switch, power shutdown, and/or n-way splitter in an integrated circuit.

SUMMARY OF THE INVENTION

The present invention concerns an apparatus comprising a switch, a balun and a splitter. The switch may be configured to provide (i) a first signal on a first path when a power signal is not present and (ii) a second signal on a second path when the power signal is present. The first path activates only the first signal and a ground signal. The second path activates only the second signal. The balun circuit may be configured to convert the second signal to a differential signal. The splitter circuit may be configured to generate a plurality of differential output signals in response to the differential signal.

The objects, features and advantages of the present invention include providing a broadband balun that may (i) implement an integrated single ended to differential active balun, (ii) provide an n-way power splitter, (iii) provide a DC power shutdown circuit, (iv) be implemented without compromising RF signal fidelity, (v) minimize distortion, (vi) provide a number of components on a single low cost Integrated Circuit, (vii) maintain linearity, (viii) provide a low noise figure performance, and/or (ix) provide a default-on path that may be useful during power failures.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
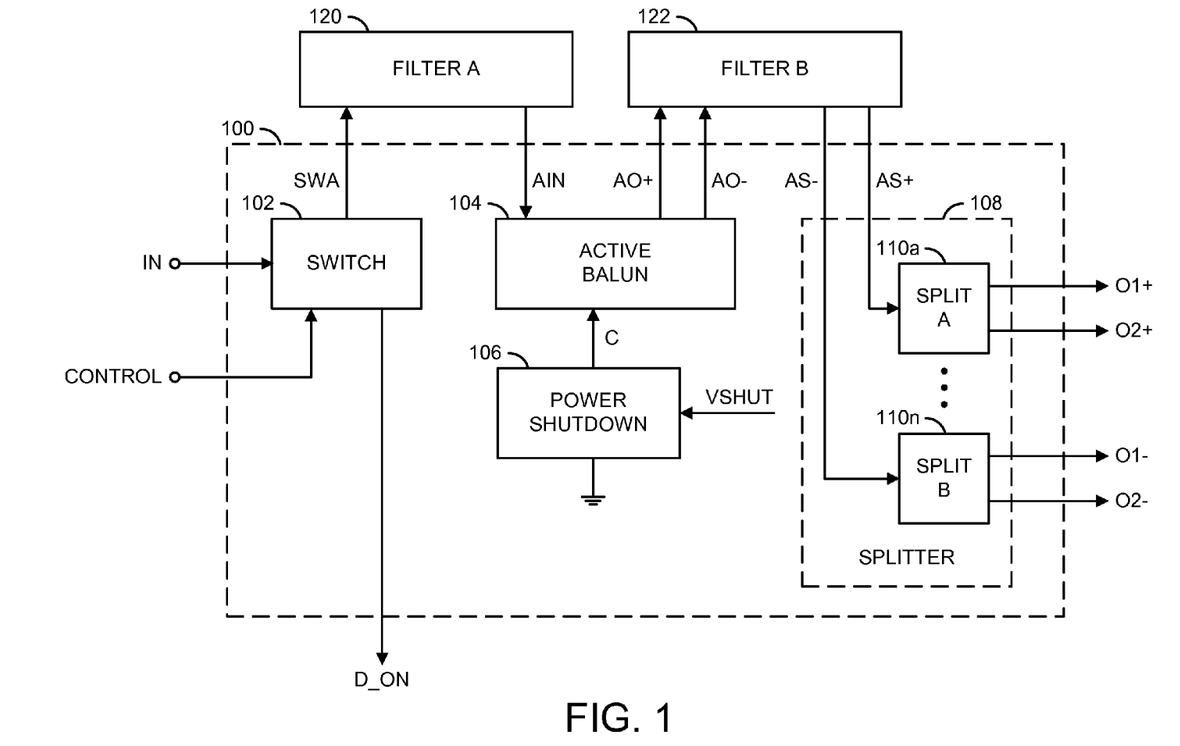
FIG. 1 is a block diagram of a context of the present invention.

Referring to FIG. 1, a block diagram of a circuit 100 is shown in accordance with a preferred embodiment of the present invention. The circuit 100 generally comprises a block (or circuit) 102, a block (or circuit) 104, a block (or circuit) 106, and a block (or circuit) 108. The circuit 100 may be connected to a block (or circuit) 120 and/or a block (or circuit) 122. The circuit 102 may be implemented as a switch. The circuit 104 may be implemented as an active balun. The circuit 106 may be implemented as a power shutdown circuit. The circuit 108 may be implemented as a splitter circuit. The circuit 108 generally comprises a number of blocks (or circuits) 110a-110n. The circuit 110a may be implemented as a first portion of the splitter circuit 108. The circuit 110n may be implemented as a second portion of the splitter circuit 108. The particular number of circuits 110a-110n may be varied to meet the design criteria of a particular implementation. For example, an unrestricted number of splitters (e.g., a 3-way, 4-way, etc.) may be implemented. The circuit 100 may implement the circuit 102, the circuit 104, the circuit 106, and/or the circuit 108 on a single Integrated Circuit. In one example, one or more of the circuit 102, the circuit 104, the circuit 106, and/or the circuit 108 may be implemented as a first Integrated Circuit. Other portions of the circuit 102, the circuit 104, the circuit 106, and/or the circuit 108 may be implemented as a second Integrated Circuit.

The circuit 102 may receive a signal (e.g., IN) and a signal (e.g., CONTROL). The signal CONTROL may be a power signal, such as a DC logic source (e.g., that may be generated in response to AC service provided to the premise). The circuit 102 may present a signal (e.g., SWA) and a signal (e.g., D_ON). The signal D_ON may represent a default on signal that may be available during a potential power failure condition. The signal IN may be a single ended input signal. The filter circuit 120 may receive the signal SWA and may present a signal AIN. The circuit 104 may receive the signal AIN and present a differential signal (e.g., AO+ and AO−). The circuit 104 may also receive a signal (e.g., C). The circuit 106 may receive a signal (e.g., VSHUT) and may present the signal C. The filter circuit 122 may receive the signals AO+ and AO− and may present a differential signal (e.g., AS− and AS+). The circuit 110a may generate a signal (e.g., O1+) and a signal (e.g., O2+) in response to the signal AS+. Similarly, the circuit 110n may generate a signal (e.g., O1−) and a signal (e.g., O2−) in response to the signal AS−.

Figure 2:
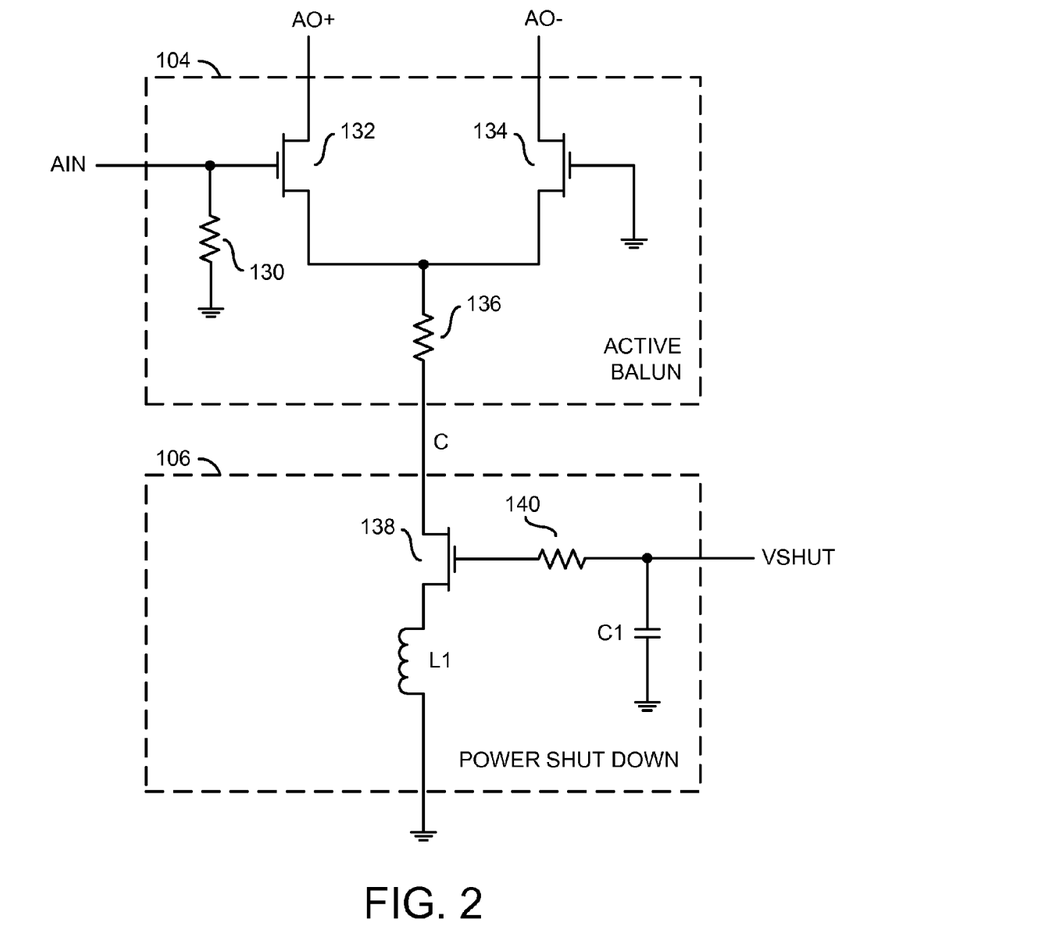
FIG. 2 is a diagram of a balun and a power shutdown circuit.

Referring to FIG. 2, a more detailed diagram of the circuit 104 and the circuit 106 is shown. The circuit 104 generally comprises a resistor 130, a transistor 132, a transistor 134 and a resistor 136. The circuit 106 generally comprises a transistor 138 and a resistor 140. The transistor 132 may have a drain that may receive the signal AO+ and a source that may be connected to the resistor 136. Similarly, the transistor 134 may have a drain that may receive the signal AO− and a source that is connected to the resistor 136. A gate of the transistor 134 may be connected to ground. A gate of the transistor 132 may be connected through the resistor 130 to ground. Additionally, the gate of the transistor 134 may receive the signal AIN. The circuit 134 may convert the differential signal AIN into a differential signal AO+ and AO−. The signal C may be connected to the sources of the transistors 132 and 134 through the transistor 136.

The circuit 106 may generate the signal C in response to the signal VSHUT. The signal VSHUT may be AC coupled to ground through a capacitor (e.g., C1). The transistor 138 may receive the signal VSHUT through the resistor 140. A source of the transistor 138 may be connected through an inductor (e.g., L1) to ground. A drain of the transistor 138 may generate the signal C. The transistors 132, 134 and 138 may be implemented, in one example, as field-effect transistors (FETs). However, the particular type of transistor implemented may be varied to meet the design criteria of a particular implementation. For example, bi-polar transistors (or other transistor types) may be implemented.

Figure 3:
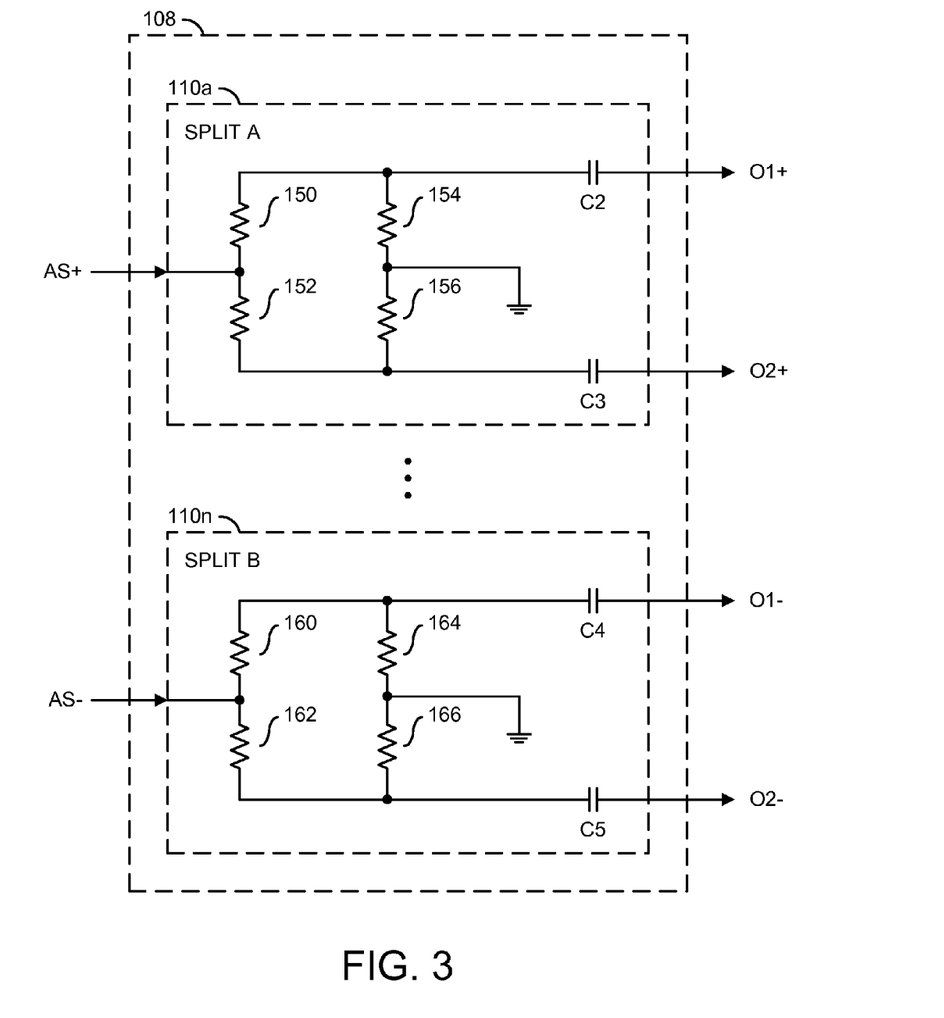
FIG. 3 is a diagram of a splitter circuit.

Referring to FIG. 3, a more detailed diagram of the circuit 108 is shown. The circuit 110a generally comprises a resistor 150, a resistor 152, a resistor 154, and a resistor 156. The signal AS+ may be presented to a node between the resistor 150 and the resistor 152. One side of the resistor 150 and one side of the resistor 154 may be used to generate the signal O1+. One side of the resistor 152 and one side of the resistor 156 may be used to generate the signal O2+. A capacitor (e.g., C2) and a capacitor (e.g. C3) may be connected to the signal O1+ and the signal O2+, respectively. The capacitor C2 and the capacitor C3 may provide DC blocking or filtering.

The circuit 110n generally comprises a resistor 160, a resistor 162, a resistor 164, and a resistor 166. The signal AS− may be presented to a node between the resistor 160 and the resistor 162. One side of the resistor 160 and one side of the resistor 164 may be used to generate the signal O1−. One side of the resistor 162 and one side of the resistor 166 may be used to generate the signal O2−. A capacitor (e.g., C4) and a capacitor (e.g., C5) may provide DC blocking and/or a filtering capacitor effect to the signal O1− and the signal O2−.

Figure 4:
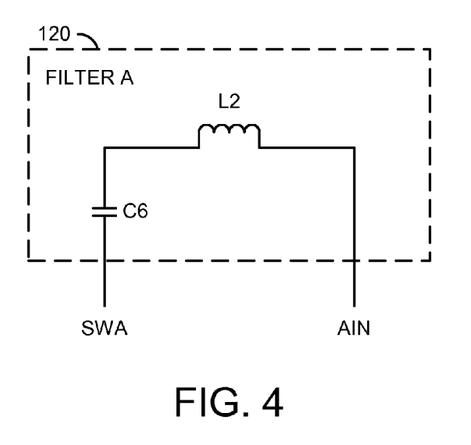
FIG. 4 is a diagram of a filter.

Referring to FIG. 4, a more detailed diagram of the circuit 120 is shown. The circuit 120 generally comprises a capacitor (e.g., C6) and an inductor (e.g., L2). The circuit 120 may be configured to generate the signal AIN in response to the signal SWA.

Figure 5:
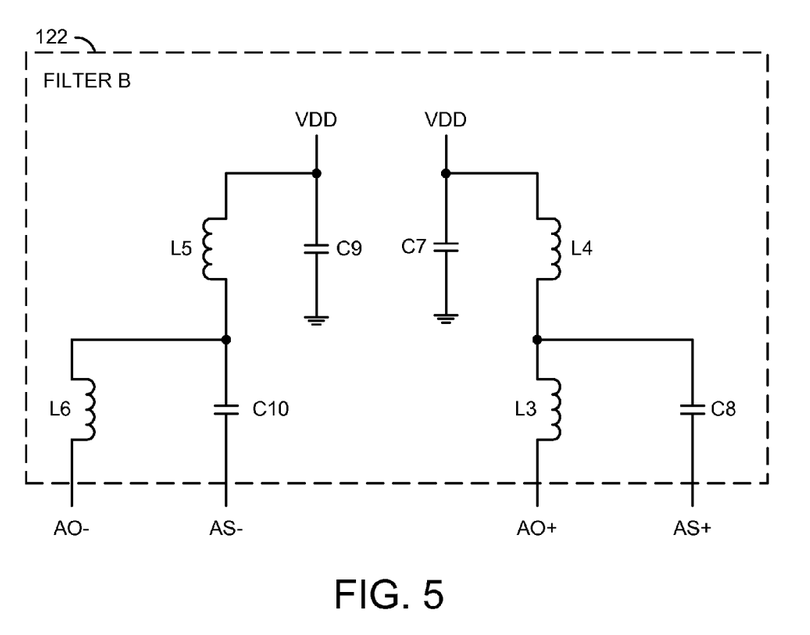
FIG. 5 is a diagram of a filter.

Referring to FIG. 5, a more detailed diagram of the circuit 122 is shown. The circuit 122 generally comprises a capacitor (e.g., C7), a capacitor (e.g., C8), a capacitor (e.g., C9), a capacitor (e.g., C10), an inductor (e.g., L3), an inductor (e.g., L4) and an inductor (e.g., L5). The capacitor C7 may be implemented as a bypass capacitor. The capacitor C8 may be implemented as a blocking capacitor. The capacitor C9 may be implemented as a bypass capacitor. The capacitor C10 may be implemented as a blocking capacitor. The circuit 122 may generate the signal AO+ and AS+ in response to differential signals AO− and AS−. The circuit 122 may be configured to filter the signal VDD from the signal AS+ and the signal AS−. The circuit 122 may also be configured to filter the signal AO+ and the signal AO− from the signal AS+ and the signal AS−, respectively.

Figure 6:
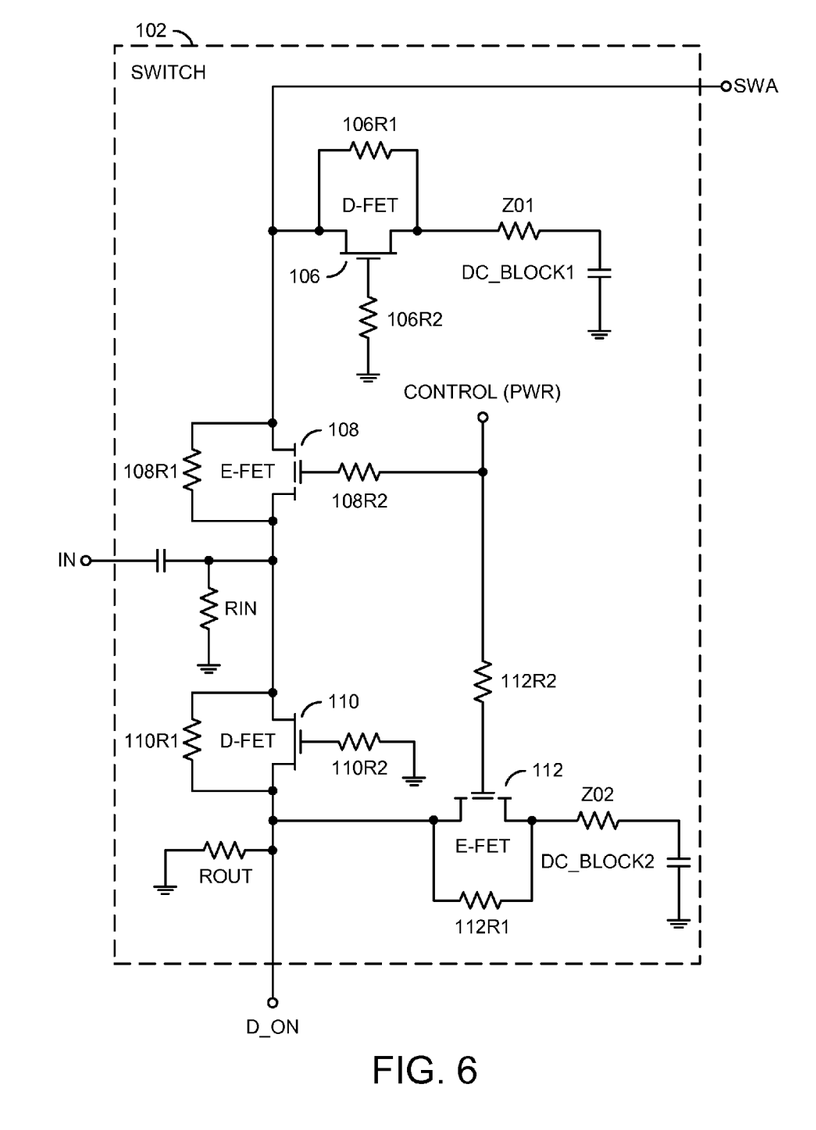
FIG. 6 is a diagram of a switch.

Referring to FIG. 6, an example of the switch 102 is shown. Details of the switch 102 may be found in co-pending application Ser. No. 13/402,340, filed Feb. 22, 2012, which is hereby incorporated by reference in its entirety. The transistor 106 is shown terminated by a resistor (e.g., Z01) and a capacitor (e.g., DC_BLOCK1). Similarly, the transistor 112 is shown terminated with a resistor (e.g., Z02) and a capacitor (e.g., DC_BLOCK2).

The circuit 100 may use the active balun circuit 104 to transform the single ended input signal IN into two output signals AO+ and AO− with 0°/180° phase differential. By implementing one or more of the circuits 102, 104, 106, and/or 108 on a single Integrated Circuit, the circuit 100 may operate with very low phase and/or amplitude imbalance. The active balun circuit 104 may provide high gain and/or low input and output match across a broad frequency band. The active balun circuit 104 may be implemented using components that may provide a broadband low return loss on all RF ports, a DC bias setting resistor and/or low phase and amplitude imbalance. The FET size and/or operating current of the transistors 132 and/or 134 may be selected to operate at low DC power (e.g., <250 mW) while maintaining low distortion and/or a high linearity, and low noise figure. The default-on switch 102, the DC power shutdown circuit 106, and/or the resistive splitter 108 may be used to provide an integrated circuit that provides a single ended to differential active balun, a default-on switch, a power shutdown, and/or an n-way power splitter functionality.

Figure 7:
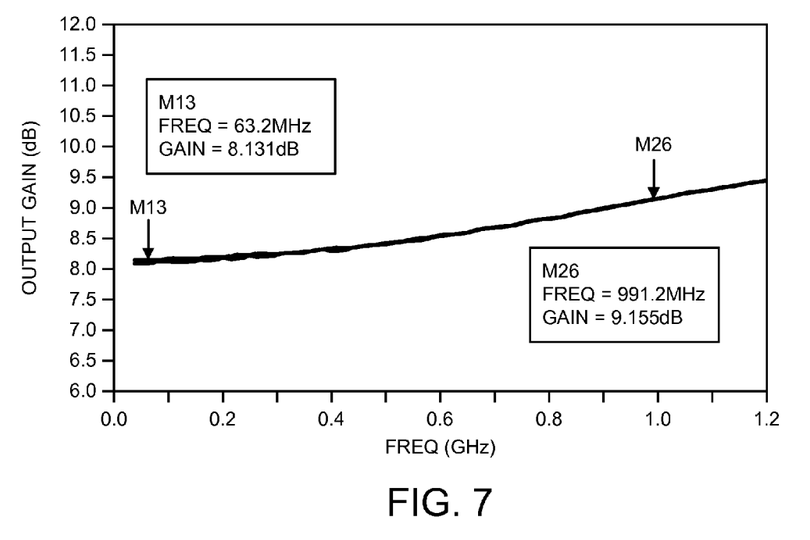
FIG. 7 is a diagram of simulated output gain performance.

Referring to FIG. 7, a simulated output gain performance of the circuit 100 is shown. The simulation shows an output gain performance (e.g., an amplification) of the circuit 100 over a linear range of frequencies (e.g., 0 Hz-1.2 GHz). A point M13 and a point M23 are shown. The point M13 is shown having a gain of 8.131 dB at a frequency of 63.2 MHz. The point M26 is shown having a gain of 9.155 db at a frequency of 991.2 MHz. The output gain performance of the circuit 100 is shown maintaining linearity of an amplified signal over the range of frequencies.

Figure 8:
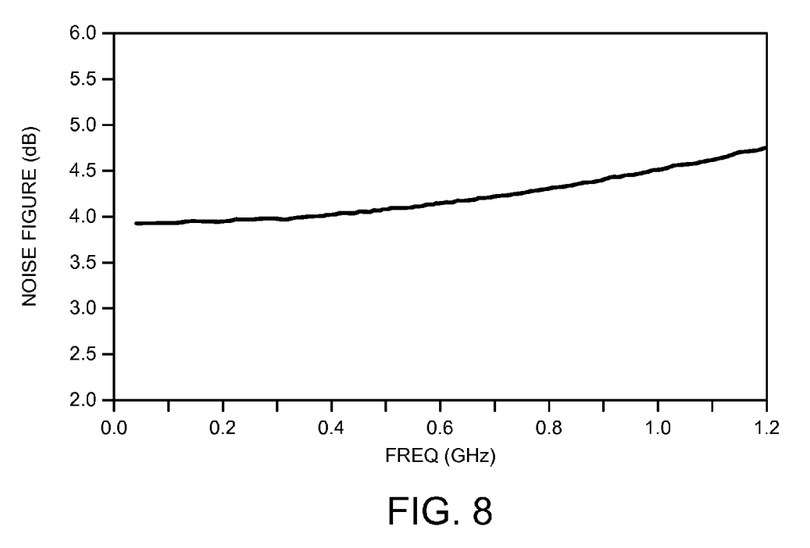
FIG. 8 is a diagram of simulated noise figure performance.

Referring to FIG. 8, a simulated noise figure performance of the circuit 100 is shown. The simulation shows a noise figure performance of the circuit 100 over the linear range of frequencies (e.g., 0 Hz-1.2 GHz). The simulation shows the circuit 100 maintaining a low noise performance over the linear range.

Figure 9:
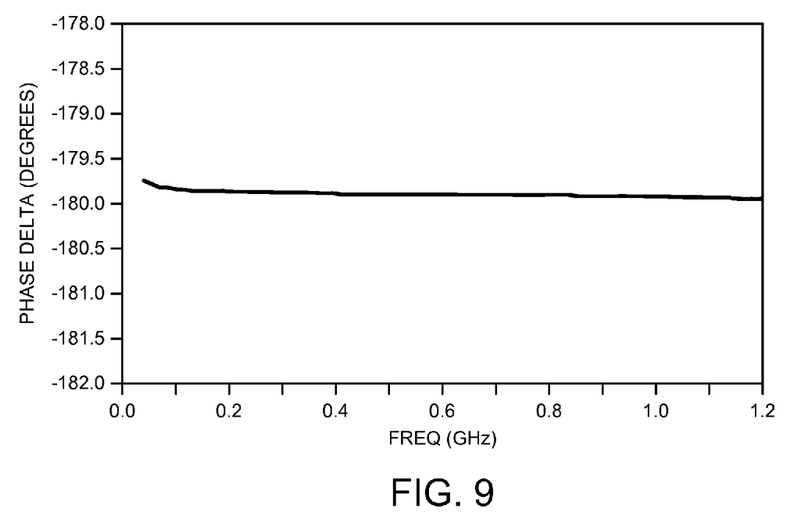
FIG. 9 is a diagram of simulated phase delta performance.

Referring to FIG. 9, a simulated phase delta performance of the circuit 100 is shown. The simulation shows a phase delta performance of the circuit 100 over the linear range of frequencies (e.g., 0 Hz-1.2 GHz). The simulation shows the circuit 100 operating with a low phase imbalance over the linear range.

Figure 10:
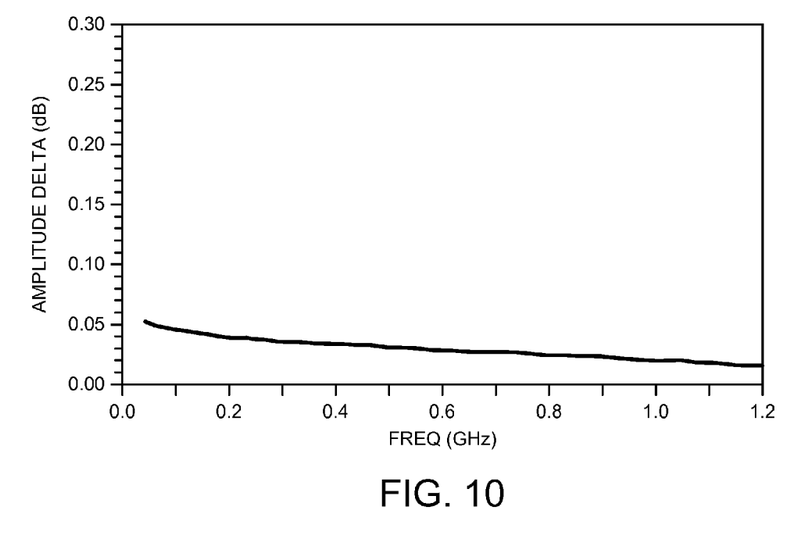
FIG. 10 is a diagram of simulated amplitude delta performance.

Referring to FIG. 10, a simulated amplitude delta performance of the circuit 100 is shown. The simulation shows an amplitude delta of the circuit 100 over the linear range of frequencies (e.g., 0 Hz-1.2 GHz). The simulation shows the circuit 100 operating with a low amplitude imbalance over the linear range.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:
1. An apparatus comprising:
a switch configured to provide (i) a first signal on a first path when a power signal is not present, (ii) a second signal on a second path when said power signal is present and (iii) a ground signal switchable to said first path when said power signal is present, wherein (i) said first path activates only said first signal and said ground signal, (ii) said second path activates only said second signal, (iii) said power signal is generated in response to an AC service provided to said apparatus and (iv) said ground signal is connected to a power ground through a termination element;

a balun circuit responsive to a third signal and configured to amplify and convert said second signal to a differential signal; and a splitter circuit configured to generate a plurality of differential output signals in response to said differential signal, wherein (A) said switch, said balun circuit and said splitter circuit are integrated on a single integrated circuit and (B) said single integrated circuit is configured to maintain a linearity of said amplified second signal over a range of frequencies.

2. The apparatus according to claim 1, wherein said apparatus operates on a secondary power source received from a battery when said power signal is not present during a power failure of said AC service.

3. The apparatus according to claim 2, wherein when said secondary power source is received from said battery (i) said first path is active and (ii) said second path is switched to said ground signal.

4. The apparatus according to claim 1, further comprising:
a power down circuit configured to control said third signal to shut down power usage in said balun circuit when said power signal is not present.

5. The apparatus according to claim 1, wherein said plurality of differential output signals are filtered through a plurality of capacitor pairs.

6. The apparatus according to claim 1, wherein said switch further comprises a plurality of said termination elements.

7. The apparatus according to claim 6, wherein each of said termination elements comprises a resistor and a capacitor.

8. The apparatus according to claim 1, wherein said balun comprises an active balun.

9. The apparatus according to claim 1, wherein said single integrated circuit is configured to maintain a low noise performance.

10. The apparatus according to claim 1, wherein said single integrated circuit is configured to operate with a low phase and amplitude imbalance.

11. The apparatus according to claim 1, wherein said amplified second signal maintained over said range by said single integrated circuit is based on a selected size of one or more transistors.

12. The apparatus according to claim 1, wherein said amplified second signal maintained over said range by said single integrated circuit is based on a selected operating current of one or more transistors.

13. The apparatus according to claim 9, wherein said low noise performance of said single integrated circuit is based on a selected size of one or more transistors.

14. The apparatus according to claim 9, wherein said low noise performance of said single integrated circuit is based on a selected operating current of one or more transistors.

15. The apparatus according to claim 1, wherein said splitter circuit implements a resistive splitter circuit.

16. The apparatus according to claim 1, wherein said range comprises a very high frequency band and an ultra high frequency band.

* * * * *